United States Patent [19]

Yanagi et al.

[11] Patent Number: 5,107,206
[45] Date of Patent: Apr. 21, 1992

[54] PRINTED CIRCUIT BOARD INSPECTION APPARATUS

[75] Inventors: Kunio Yanagi; Keiichi Ikeda, both of Sagamihara, Japan

[73] Assignee: Tescon Co., Ltd., Sagamihara, Japan

[21] Appl. No.: 702,858

[22] Filed: May 20, 1991

[30] Foreign Application Priority Data

May 25, 1990 [JP] Japan ............................ 2-134204
Oct. 17, 1990 [JP] Japan ............................ 2-276371
Nov. 21, 1990 [JP] Japan ............................ 2-314307

[51] Int. Cl.⁵ .......................... G01R 1/02; G01R 1/04
[52] U.S. Cl. ........................... 324/158 F; 324/158 P; 33/1 M; 269/71; 269/73
[58] Field of Search ............... 324/12.5, 158 P, 158 F; 269/71, 73; 33/1 M

[56] References Cited

U.S. PATENT DOCUMENTS

| | | | |
|---|---|---|---|
| 4,092,593 | 5/1978 | Wolk | 324/158 F |
| 4,267,507 | 5/1981 | Guerpont | 324/158 P |
| 4,362,991 | 12/1982 | Carbine | 324/158 F |
| 4,471,298 | 9/1984 | Frohlich | 324/158 F |
| 4,523,749 | 6/1985 | Kindgren et al. | 269/73 |
| 4,527,119 | 7/1985 | Rogers et al. | 33/1 M |
| 4,574,235 | 3/1986 | Kelly et al. | 324/158 F |
| 4,705,447 | 11/1987 | Smith | 269/71 |
| 4,908,571 | 3/1990 | Stolhr | 324/158 F |

FOREIGN PATENT DOCUMENTS 2637878 3/1978 Fed. Rep. of Germany ... 324/158 F
57-98869 6/1982 Japan .

*Primary Examiner*—Kenneth A. Wieder
*Assistant Examiner*—William J. Burns
*Attorney, Agent, or Firm*—Armstrong, Nikaido, Marmelstein, Kubovcik & Murray

[57] ABSTRACT

An improved printed circuit board inspection apparatus in which its inspection probes are made to contact with a selected part or printed circuit section on a printed circuit board for making an inspection on the selected part or printed circuit section in terms of their performances or functions. The printed circuit board inspection apparatus uses two guide sets each having at least one pair of inspection probes and driving means to drive said inspection probes in X- and Y-directions to selected coordinate positions in the printed circuit board. A central processing unit controls said driving means so that the inspection probes of one guide set are used to make an inspection at a selected coordinated position while the other inspection probes are traveling to another selected coordinate position for subsequent inspection according to a predetermined program.

6 Claims, 13 Drawing Sheets

PRINTED CIRCUIT BOARD INSPECTION APPARATUS

BACKGROUND OF THE INVENTION

1. Field of the Invention

The present invention relates to an apparatus for making an inspection on selected printed circuit or discrete circuit elements on a bare board or printed circuit board with the aid of inspection probes (hereinafter referred to as "probe") to find defects if any, or determine their performances.

2. Description of the Prior Art

In making an inspection on a printed circuit board by eye as to whether all discrete circuit elements are fixed at correct positions it is liable to overlook defective printed circuit boards when eyes get tired. Also, disadvantageously inspection which uses apparatus requires different jigs designed for exclusive use for particular printed boards, and accordingly inspection cost increases. In an attempt to reduce such difficulties some printed circuit board inspection apparatuses have been proposed so that printed circuit boards may be subjected to quick measurements as to: whether they have discrete circuit elements; what kinds of discrete circuit elements are mounted; what functions such discrete circuit elements have; or whether short-circuits or disconnections exist in printed circuit patterns. The results of such measurements are compared with data stored in memories to make a final decision on each discrete circuit element or printed circuit pattern. One example of such inspection apparatus is given in Japanese Patent 57-98869(A).

FIG. 22 is copied from the sole drawing of the Japanese Patent 57-98869(A). The inspection apparatus comprises a first X-Y driving unit 201 and a second X-Y driving unit 202. Each X-Y driving unit has a cross arm 203 or 204 slidable along the stationary beam of the X-Y driving unit 201 or 202. Each cross arm 203 or 204 has a probe 205 or 206 slidably fixed thereto. The first and second X-Y driving units 201 and 202 are connected to a control 209 so that these driving units may be driven according to program.

In operation a pair of probes 205 and 206 are moved above a printed circuit board to a selected coordinate position under the command derived from floppy disks or other recording mediums, and then these probes 205 and 206 are made to contact to selected two points for instance, two legs of a selected discrete element on the printed board. A voltage or current of such a slight magnitude as would cause no harm to the element, is applied to the element to determine the kind, performance or characteristics of the element or detect defects or disconnections if any, in the element or associated circuits. Similar operations and inspections are repeated one after another in the predetermined order.

The length of time involved for inspection (hereinafter referred to as "tact time") is consisted of: the first section in which the probes are raised after completion of the inspection at a selected coordinate position; the second section in which the probes are moved to another selected coordinate position; the third section in which the probes are lowered; and the fourth section in which an inspection is made. The sections other than the fourth section is preferably shortened to possible minimum. The second section is long compared with the other sections, and therefore the loss of time cannot be reduced without shortening the second section.

Also, disadvantageously the freedom with which a probe whose shape is appropriate for the terminal shape of a selected discrete circuit element can be selected and changed is limited because only a single probe can be fixed to a movable arm. The contact by the probes on soldered terminals in printed circuit boards are repeated so many times that the probe tips may be deformed, and accordingly the electrical resistance at contact positions will be changed. This will decrease the accuracy with which an inspection is made. In an attempt to permit inspections to be repeated with same accuracy probes must be changed several times a day. This, however, requires tedious and time-consuming work, and accordingly operating efficiency is lowered.

In case that an inspection is made on an integrated circuit a three-point measurement is often required, but a conventional inspection apparatus cannot meet this request.

SUMMARY OF THE INVENTION

In view of the above one object of the present invention is to provide a printed circuit board inspection apparatus which is capable of moving its probes to a selected coordinate position in a minimum possible time.

Another object of the present invention is to provide a printed circuit board inspection apparatus which permits reduction of probe changing times and accordingly an increase of operating efficiency, and permits selection of probes whose shape is appropriate for the particular terminal shape of selected circuit elements to be tested.

Still another object of the present invention is to provide a printed circuit board inspection apparatus which permits a three-point inspection on a selected element or portion in a printed circuit board, and permits application of selected probes to a selected element or portion no matter where it may be located in a printed circuit board.

To attain these objects a printed circuit board inspection apparatus according to the present invention comprises: mounting means to fix a printed circuit board at a predetermined position; two or more guide sets each composed of a pair of upper and lower crossbar assemblies, each crossbar assembly having an arm suspending from the crossbar assembly and equipped with at least one probe at its end, and driving means to drive the crossbar assembly in an X-direction above said printed circuit board, and to drive said arm in a Y-direction perpendicular to said X-direction and raise or lower associated probe; and a central processing unit to command said driving means to bring selected probes to selected positions above said printed circuit board and to lower such probes until they come to contact the terminals of selected discrete circuit elements or printed circuit for detecting short-circuits or disconnections if any, in said printed circuit board, or for determining the kind of function each of said selected discrete circuit elements.

With this arrangement the probes of one guide set makes an inspection on a selected circuit element or printed circuit while the probes of the other guide set are running to another selected position in which another inspection is to be performed under the control of said central processing unit. Thus, upon completion of the precedent inspection the probes of the other guide set have reached another selected position, and therefore the subsequent inspection can be started immediately after completion of the precedent inspection. A sequence of inspections can be made one after another without intermission according to the program stored in the central processing unit.

As described, two or more guide sets each having at least two probes are allowed alternately to make an inspection on a selected part of a printed circuit board without intermission, thus reducing waiting time involved for transporting the probes in X-direction, and hence reducing the tact time to possible minimum, and accordingly improving the operating efficiency.

Each arm may comprise a metal piece slidably mounted to an associated crossbar assembly, a mount plate fixed to said metal piece, a pair of probe heads vertically movably fixed to said mount plate, and drive means to raise or lower said probe heads.

With this arrangement two probes of same or different kinds may be fixed to a single arm via its probe head pair. When two probes of same kind are used, advantageously the probes can be alternately used without being changed for an elongated length of time. When two probes of different kinds are used, advantageously the probes can be selectively used to fit a particular terminal shape soldered to a selected part of the printed circuit pattern for accurate inspection.

Drive means to raise or lower the probe heads may comprise a stepping motor, a rotatable link plate connected to the shaft of the stepping motor at the center of the rotatable link plate, and having two pins projecting from the opposite ends of the rotatable link and slidably fitted in lateral slots made in the upper ends of the probe heads, whereby when the stepping motor rotates the rotatable link plate to move the pins along circular path in opposite directions while the pins remain in the lateral slots, one probe head is raised while the other probe head is lowered.

The stepping motor can start quickly in response to command, and accordingly the probe heads can be vertically driven quickly, compared with pneumatic drive means. This quick response has the effect of reducing the tact time appreciably. In operation the stepping motor begins to rotate the rotatable link plate from its horizontal position step by step, thus moving the pins along circular path in opposite directions while the pins remain in the lateral slots to raise one probe head and at the same time, lower the other probe head. As for the descending probe head the vertical distance component of the rotatable link reduces quickly for each incremental step along the circular path as the rotatable link is getting close to its vertical position. In other words the speed at which the probe head descends towards a selected circuit element to be inspected will decrease gradually, thus assuring the soft landing of the descending probe on the terminal of the circuit element to prevent any damage to the terminal.

The pair of probe heads may be fixed to the mount plate so as to converge and cross in their phantom extensions at a predetermined point in one and same plane in which the probe heads lie.

A three-point inspection can be made by using the two probes of one arm and by selectively using one of the two probes of another arm while putting apart the other probe which is supposed to intervene in the inspection. Selective use of all four arms each having a pair of probes directed at selected angles in X- and Y-directions permits an inspection on a selected part on a printed circuit board by putting selected arms in the vicinity of the selected part no matter in which direction the selected part may be oriented.

In designing a circuit pattern on a printed circuit board it is unnecessary to provide a conductor extension from a selected terminal which otherwise, would prevent an access to the terminal for inspection. Such conductor extension is required for inspection by a conventional printed circuit board inspection. No requirement for such conductor extension permits the increase of the freedom with which a circuit pattern can be designed. An inspection can be made by putting selected probes in contact with a selected part of the circuit pattern in a position most appropriate for the inspection, and accordingly the inspection data thus provided will be of improved reliability. Also, the physical range within which inspections can be made, is expanded in a printed circuit board in all directions, and this will contribute to automatization of inspection on printed circuit boards.

Other objects and advantages of the present invention will be understood from the following description of preferred embodiments of the present invention, which are shown in accompanying drawings.

DESCRIPTION OF THE PREFERRED EMBODIMENTS

Figure 1:
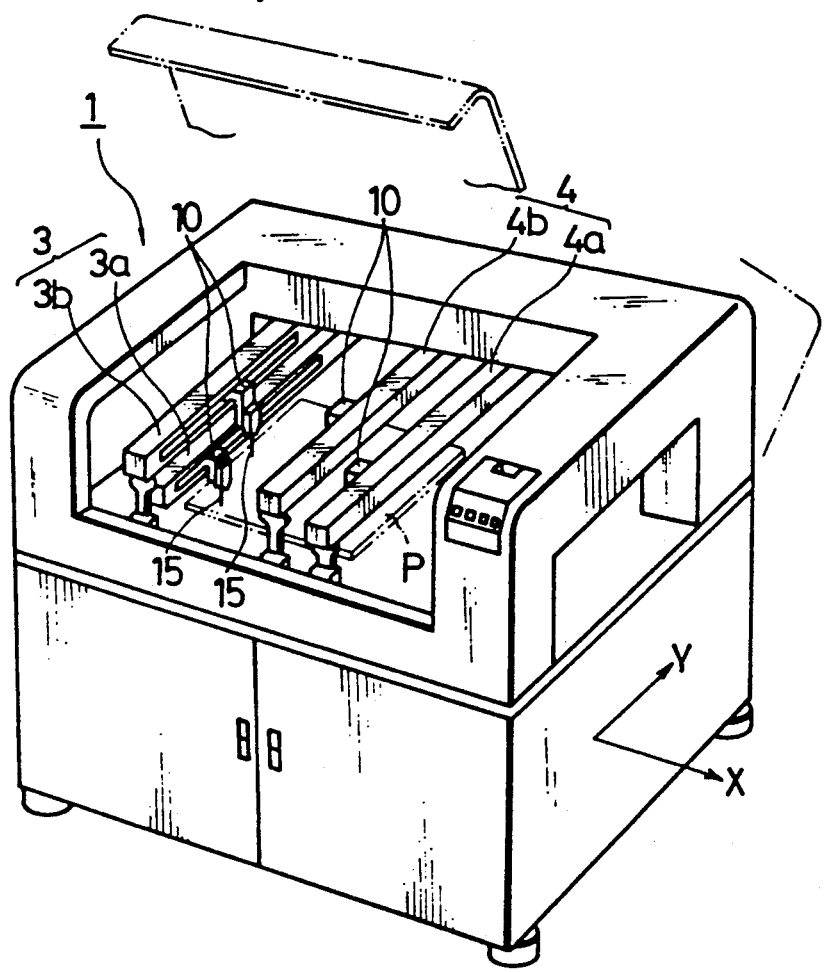
FIG. 1 is a perspective view of a printed circuit board inspection apparatus according to one embodiment of the present invention.
Figure 2:
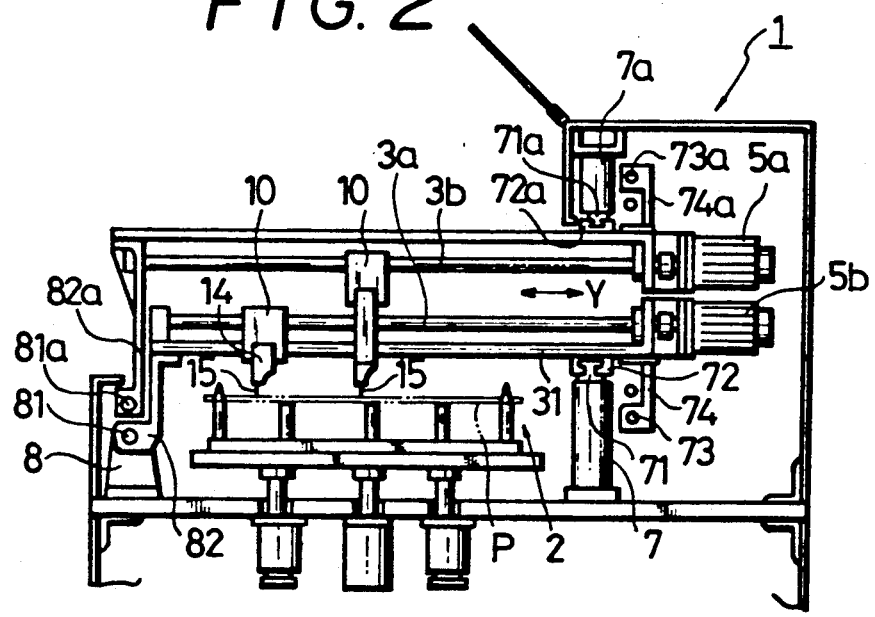
FIG. 2 is a cross section of the printed circuit board inspection apparatus of FIG. 1.
Figure 3:
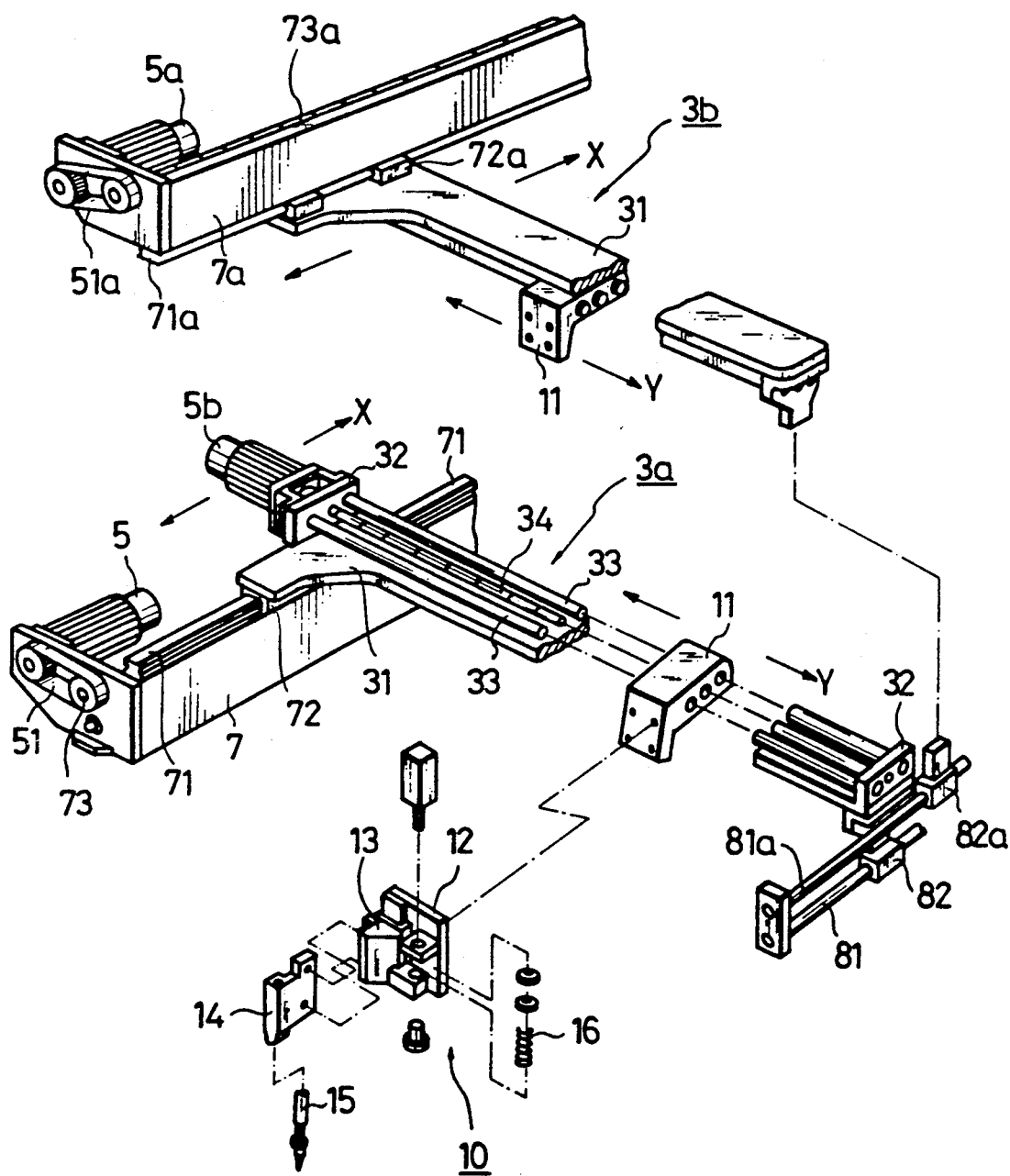
FIG. 3 is an exploded perspective view of upper and lower crossbar assemblies, showing drive mechanisms to drive the crossbar assemblies in X-direction and associated arms in Y-direction.

Printed circuit board inspection apparatus 1 according to the present invention comprises mounting means 2 to fix a printed circuit board P at a predetermined position, and two guide sets 3 and 4 each composed of a pair of upper and lower crossbar assemblies 3b, 3a and 4b, 4a. Each crossbar assembly is adapted to be driven by associated driving means 5 in an X-direction above the printed circuit board P. Referring to FIGS. 2 and 3, one end of lower crossbar assembly 3a of one guide set 3 is slidably fixed to guide rail 71 of support plate 7 with the aid of C-shaped metal 72 whereas the other end of lower crossbar assembly 3a is slidably fixed to guide rod 81 of bracket support 8 via arm 82. Lower crossbar assembly 3a can be driven by servomotor 5 in X-direction. As best shown in FIG. 3, servomotor 5 is fixed to one end of support plate 7, and is connected to drive rod 73 by endless belt 51. Drive rod 73 has threads thereon, and it is rotatably fixed to support plate 7, extending parallel with guide rail 71. Guide piece 74 has a threaded hole, and it is integrally connected to one end of lower crossbar assembly 3a. Guide piece 74 screws onto drive rod 73, thus permitting guide piece 74 and hence lower crossbar assembly 3a to be driven in X-direction by clockwise or counterclockwise rotation of servomotor 5. In place of drive rod 73 and guide piece 74 rack-and-pinion, timing belt, wire drive or any other transmission may be used.

Likewise, one end of upper crossbar assembly 3b of one guide set 3 is slidably fixed to guide rail 71a of support plate 7a with the aid of C-shaped metal 72a whereas the other end of upper crossbar assembly 3b is slidably fixed to guide rod 81a via arm 82a. A similar drive mechanism is used to drive upper crossbar assembly 3b in X-direction. The clockwise or counterclockwise rotation of servomotor 5a is transmitted to drive rod 73a via endless belt 51a, thereby guide piece 74a and hence upper crossbar assembly 3b in X-direction.

Another pair of upper and lower crossbar assemblies 4b and 4a of the other guide set 4 uses a similar drive mechanism. Thus, two sets of upper and lower crossbar assemblies 3b, 3a and 4b, 4a can be driven by associated servomotors 5 and 5a in X-direction. It, however, should be noted that lower crossbar assemblies 3a and 4a are controlled to keep running behind upper crossbar assemblies 3b and 4b respectively.

As is best seen from FIG. 3, each crossbar assembly has two parallel stationary guide rods 33 and intermediate rotatable drive rod 34 fixed to brackets 32, which are integrally connected to the opposite ends of crossbeam 31. Intermediate drive rod 34 has threads thereon. Metal piece 11 has two smooth holes and an intermediate threaded hole. Guide rods 33 are inserted in the smooth holes of metal piece 11, and drive rod 34 is threadedly inserted in the intermediate threaded hole of metal piece 11. As shown, one end of drive rod 34 is connected to servomotor 5b. Servomotor 5b is fixed to the side of bracket 32 opposite to the side on which guide rods 33 and drive rod 34 are fixed.

With this arrangement metal piece 11 can be driven above a printed circuit board P in Y-direction through the agency of transmission rod 34 when servomotor 5b rotates clockwise or counterclockwise. Guide rods 33 assures stable running of metal piece 11.

Arm 10 suspends from crossbar assembly 3a or 3b, and it is equipped with at least one probe 15 at its end. As seen from FIG. 3, each arm includes a mount plate 12 bolted to metal piece 11, and a probe head 13 vertically movably fixed to mount plate 12. Probe head 13 has mount piece 14, and probe 15 is mounted to mount piece 14. Probe head 13 is spring-biased downward by coiled spring 16, and probe head 13 may be raised or lowered a predetermined distance by pneumatic cylinder (not shown).

As described earlier, each of two guide sets 3 and 4 is composed of a pair of upper and lower crossbar assemblies, and each crossbar assembly has an arm 10. A pair of arms 10 which are associated with each guide set 3 or 4 are so arranged that these arms 10 may not interfere with each other in traveling in Y-direction.

The printed circuit board inspection apparatus further comprises a central processing unit to command all servomotors to bring inspection probes 15 to selected positions above a printed circuit board P, and command arms 10 to lower such inspection probes until they come to contact the terminals of selected discrete circuit elements or printed circuit for detecting short-circuits or disconnections if any, in the printed circuit board P, or for determining the kind or function each of selected discrete circuit elements.

Figure 4:
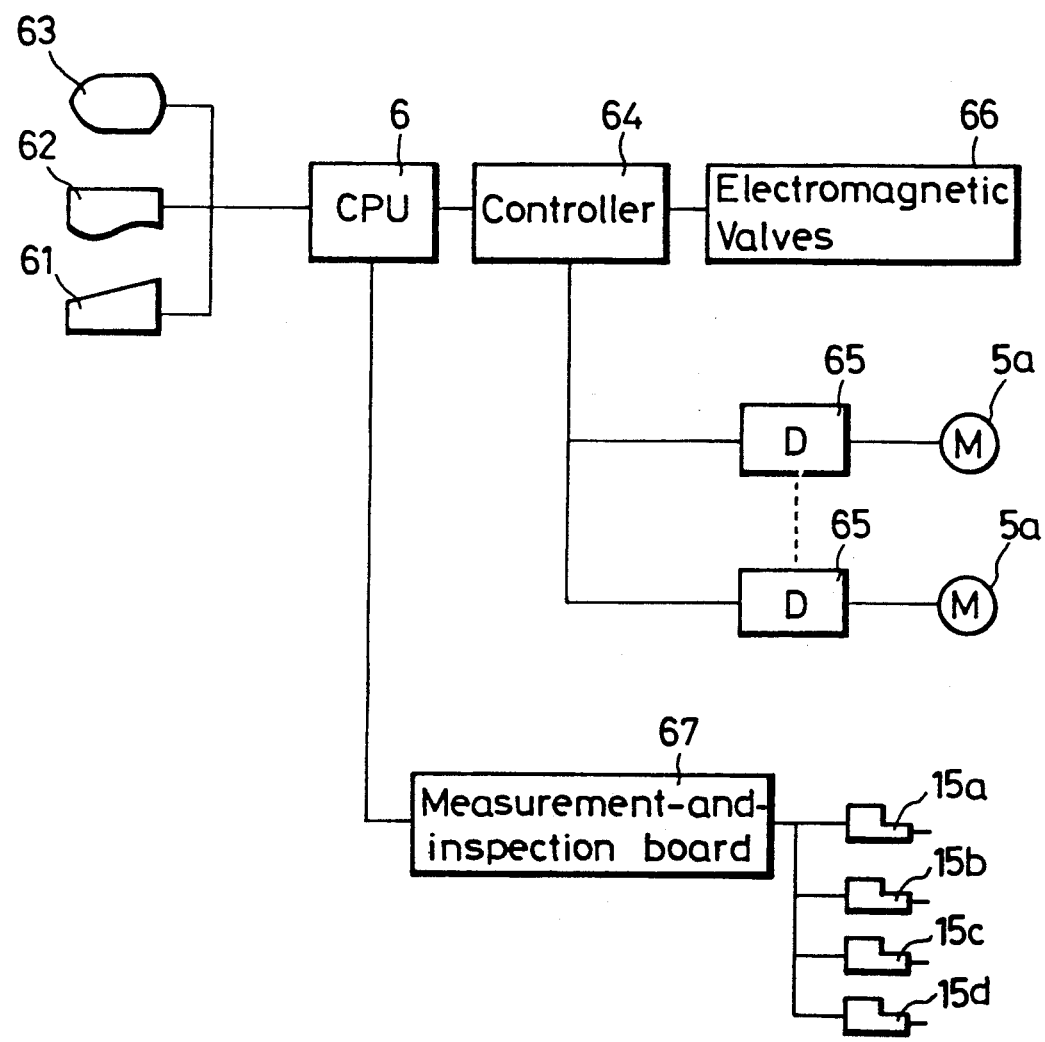
FIG. 4 shows schematically a control system for the printed circuit board inspection apparatus.

As seen from FIG. 4, central processing unit 6 is connected to every driving means 65, and is associated with keyboard 61 for inputting pieces of information, display 62 for displaying data representing inspection results provided by probes 15, and printer 63 for outputting recordings.

Figure 5:
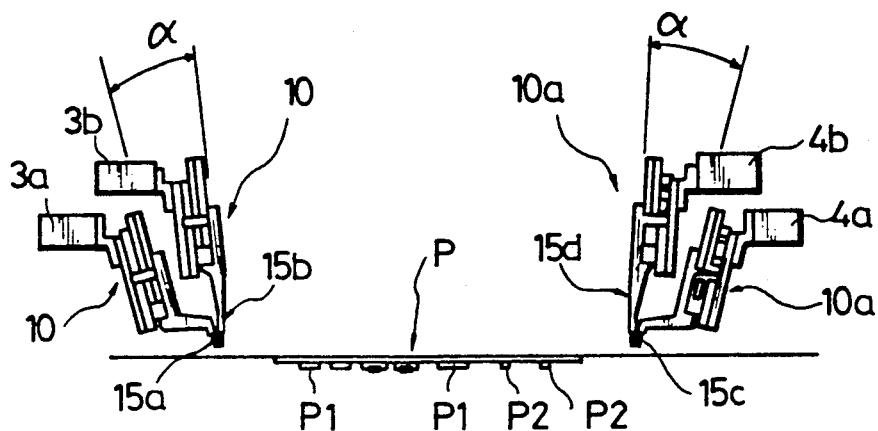
FIG. 5 shows one mode in which two pairs of probes are arranged on a printed circuit board.
Figure 6:
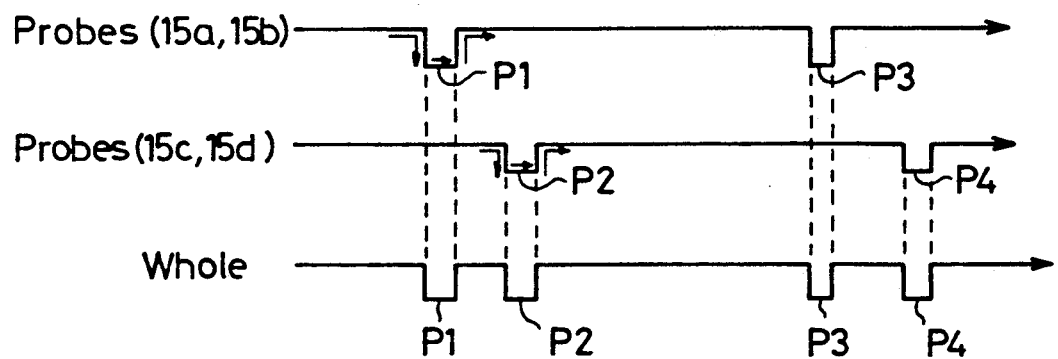
FIG. 6 shows timing chart according to which two pairs of probes are used for inspection.

Referring to FIGS. 4 to 6, the basic operation of printed circuit board inspection apparatus 1 is described below.

When a printed circuit board P is transferred in printed circuit board inspection apparatus 1 by a belt conveyer or any other conveying means, the printed circuit board P is fixed to board mount 2. Then, inspection-start command is dispatched by keyboard 61. In response to this command central processing unit 6 gives instructions to drivers 65 via controller 64 so that associated servomotors 5, 5a rotate according to predetermined program, thereby driving arms 10 in X- and Y-directions to selected coordinate positions. As shown in FIG. 5, a pair of arms 10, 10 and 10a, 10a are inclined a predetermined angle $\alpha$ with respect to each other.

In this particular embodiment two servomotors are used in driving a single arm in X- and Y-directions, and therefore eight servomotors and hence eight drivers 65 are required in total.

When arms 10 are brought to desired coordinate positions, central processing unit 6 dispatches a command to controller 64, thereby permitting electromagnetic valves 66 to open (or close). Then, pneumatic cylinders (not shown) function to lower associated probes until their tips have come to contact with the legs of a selected discrete element on the printed circuit board P. In response to inspection command from central processing unit 6 measurement-and-inspection board 67 makes required measurement and inspection to determine the kind, performance and other characteristics of each selected discrete element to send the measurement and inspection data back to central processing unit 6.

When central processing unit 6 receives a signal representing the termination of measurement and inspection, it dispatches a command signal to controller 64 to permit electromagnetic valve 66 to close (or open), thereby raising associated probes apart from the printed circuit board. Again, central processing unit 6 dispatches another command to controller 64, thereby permitting drivers 65 to send control signals to associated servomotors 5, 5a. Then, servomotors 5, 5a rotate to move associated arms 10 to another selected coordinate positions.

Thus, a pair of probes 15a and 15b of one guide set 3 are making an inspection on a selected circuit element P1 or selected printed circuit while a pair of probes 15c and 15d of the other guide set 4 are running to another selected position, where subsequent inspection starts on another selected circuit element P2 or selected printed circuit immediately after termination of the preceding inspection. In this way the probe pairs of two guide sets carry out required measurements and inspections alternately at different selected positions on a printed circuit board. In alternate operation, both pairs of probes 15a, 15b and 15c, 15d of two guide sets 3 and 4 will be brought simultaneously to a selected position, where two inspections may be carried out one after another. Further, the combination of this operation and the above mentioned will be adopted necessarily.

Thanks to this operation in which one probe pair of one guide set performs required measurement and inspection while one probe pair of the other guide set travels to a subsequent selected position, the tact time involved is reduced to about 0.2 to 0.15 seconds, compared with about 0.5 seconds in a conventional printed circuit board inspection apparatus. Also, the simultaneous arrival of two probe pairs at a selected position will halve the time involved for required inspection.

Referring to FIGS. 7 to 21, a printed circuit board inspection apparatus according to another embodiment of the present invention will be described below.

Figure 7:
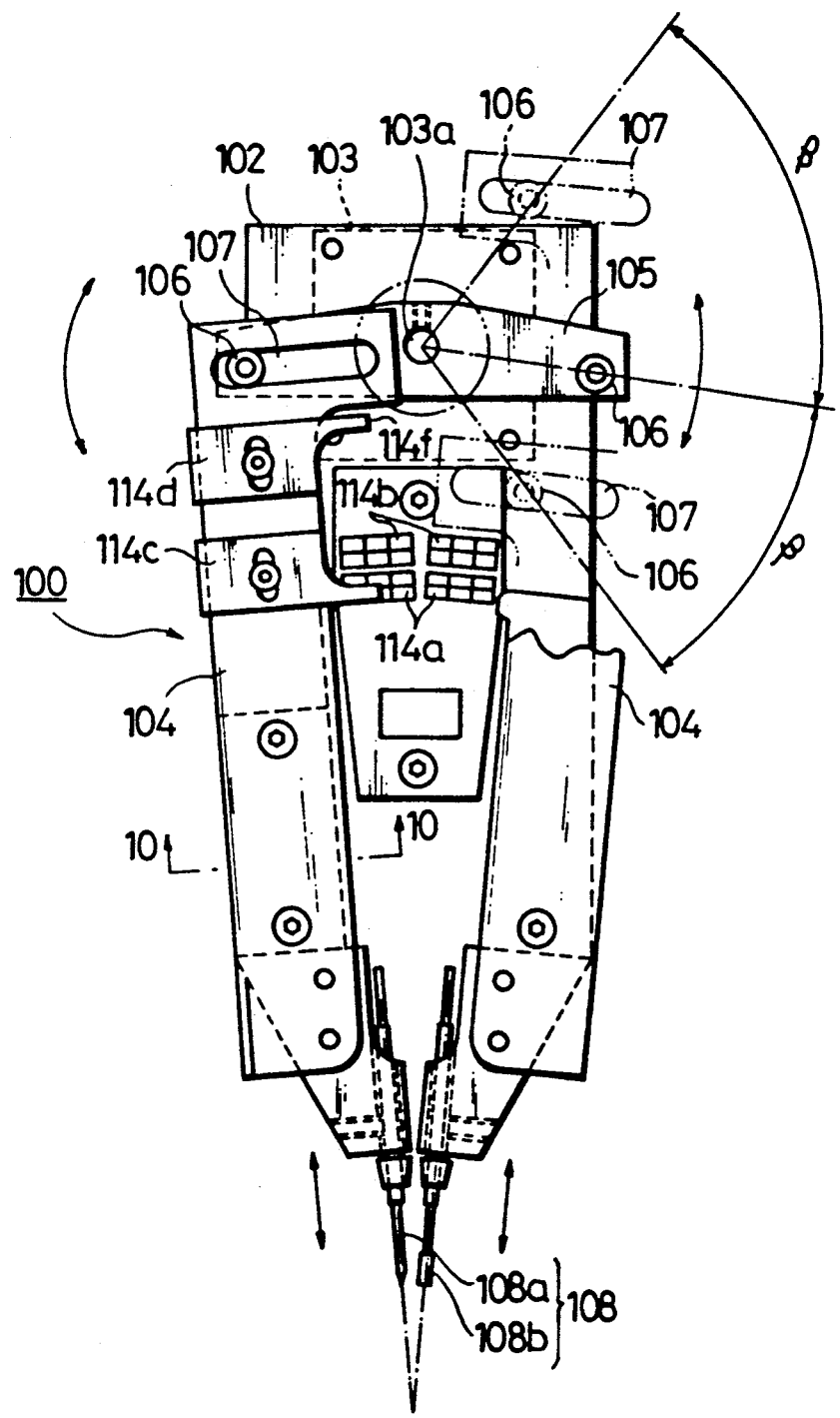
FIG. 7 is a front view of an arm which is different from those appearing in FIGS. 1 and 2.
Figure 8:
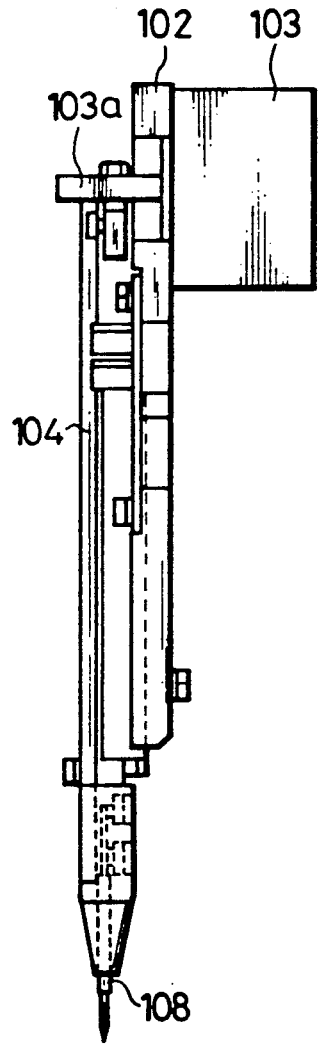
FIG. 8 is a side view of the arm of FIG. 7.

As seen from FIG. 7, a single arm 100 instead of arm 10 has a pair of probe heads 104 and 104.

Figure 10:
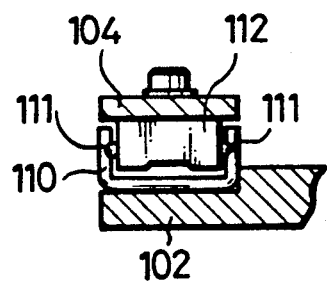
FIG. 10 is a section view of lines 10—10 in FIG. 7 showing a sliding part of the probe head.
Figure 11:
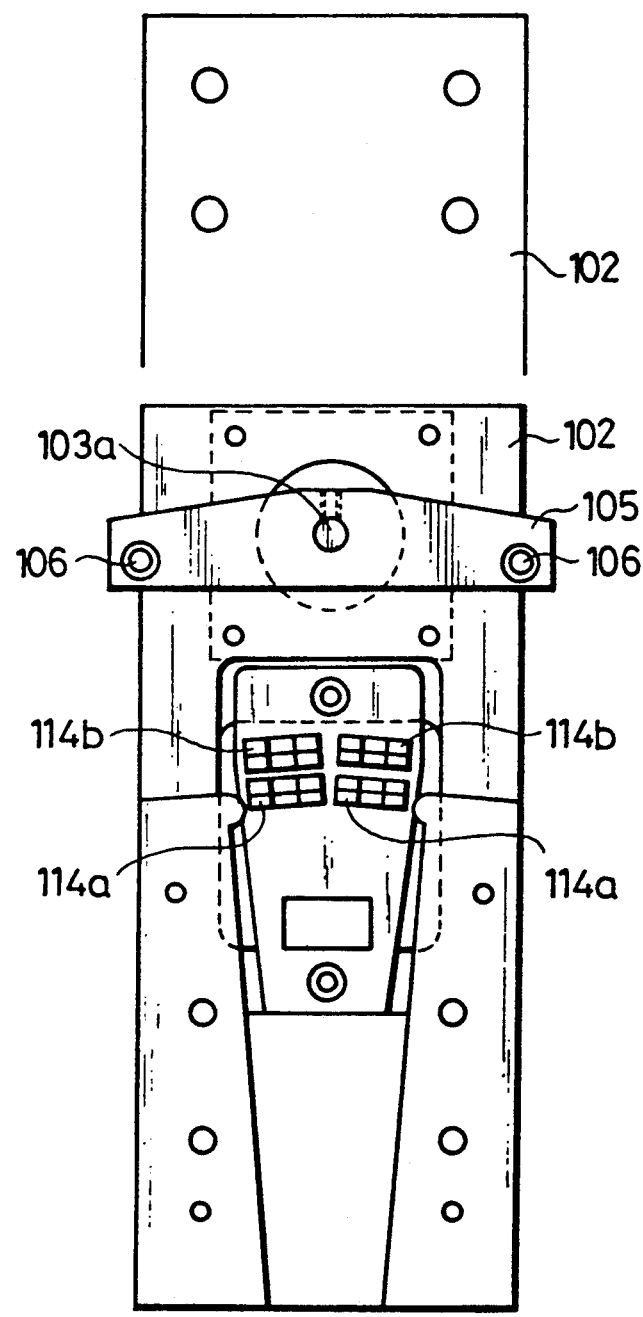
FIG. 11 is a front view of a mount plate of the arm.

Mount plate 102 is bolted to mount metal 103, which is adapted to be driven in Y-direction. Each probe head 104 is slidably attached to mount plate 102 via vertically slidable piece 112, which is slidably fitted in C-shaped guide 110 with the aid of ball bearings 111 attached to the inner opposite walls of C-shaped guide 110, as shown in FIG. 10.

Stepping motor 103 is attached to the upper, rear side of mount plate 102 for driving probe heads 104. Shaft 103a of stepping motor 103 projects from the front of mount plate 102 to be fixed to swingable link plate 105 at its center. Swingable link plate 105 has two pins 106 and 106 projecting from its opposite ends.

Each probe head 104 has lateral slot 107 at its upper end, and each pin 106 of swingable link plate 105 is slidably fitted in lateral slot 107. With this arrangement the clockwise rotation of stepping motor 103 will cause the right probe head 104 to be pushed down by the right pin 106 of swingable link plate 105. At the same time, the left probe head 104 will be pulled up by the left pin 106 of swingable link plate 105. Pin 106 may be simply in the form of rod. It may be made of a rod and a cylindrical collar rotatably enclosing the rod. Preferably it may be consisted of a fixed rod and a bearing turning on the fixed rod.

Figure 13A:
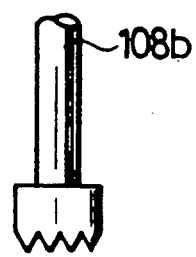
FIG. 13A shows the tip of a probe.
Figure 13B:
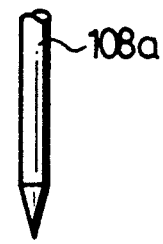
FIG. 13B shows the tip of another probe.

Probe heads 104 have probes 108a and 108b of same or different shapes attached to their tips. Such probes 108 may be selectively used to meet the shape of an object on which an inspection is to be made. FIG. 13A shows a crown type probe 108b whereas FIG. 13B shows a pin-pointed type probe 108a.

A pair of probe heads 104 and 104 are fixed to mount plate 102 so as to converge and cross in their phantom extensions at a predetermined point in one and same plane in which probe heads 104 lie.

Figure 9:
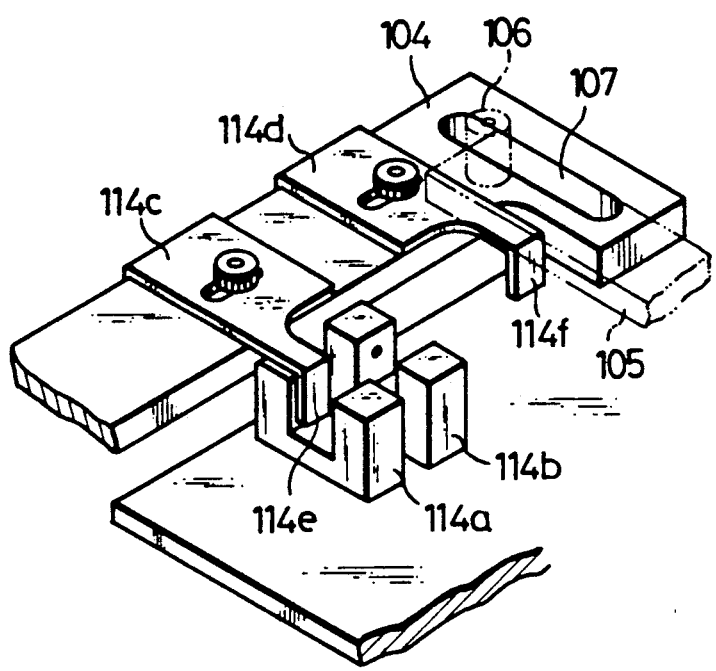
FIG. 9 is an enlarged perspective view of a fraction of the arm of FIG. 7.

As seen from FIGS. 7 and 9, mount plate 102 has photo sensors 114a and 114b on mount plate 102 to detect the probe position whereas probe heads 104 have detection plates 114c and 114d attached thereto adjustably in position. In operation when the angle ends 114e and 114f of detection plates 114c and 114d pass photo sensors 114a and 114b to prevent light beam from throwing onto their photo detection parts, thereby permitting electrical detection of the position of probe heads 104 to make switches associated with stepping motor 103 to turn on or off. Thus, the distance range within which each probe head 104 can travel may be limited by adjusting detection plates 114c and 114d in position.

Figure 12:
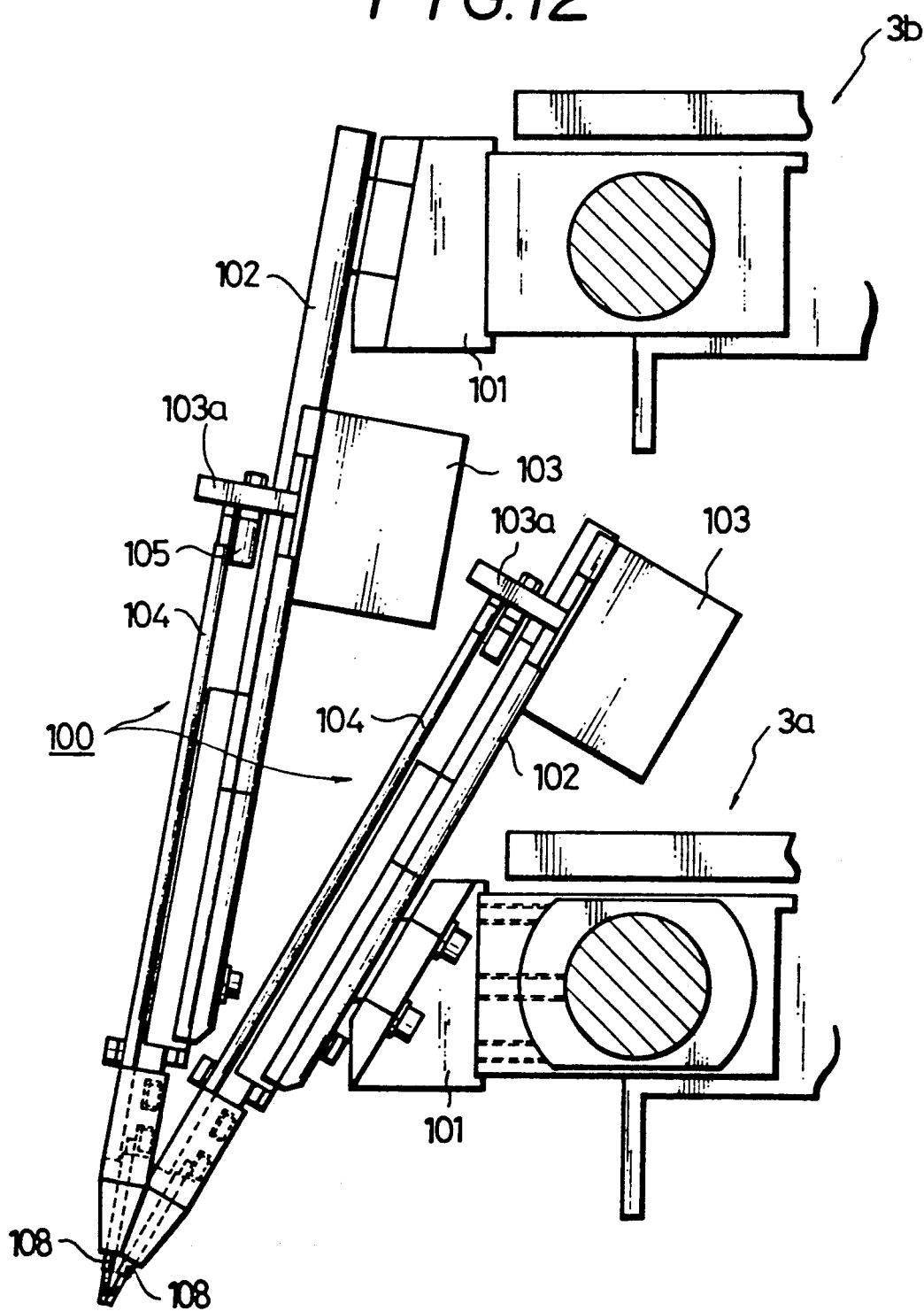
FIG. 12 is a side view of two arms fixed to the upper and lower guide crossbar assemblies.
Figure 14:
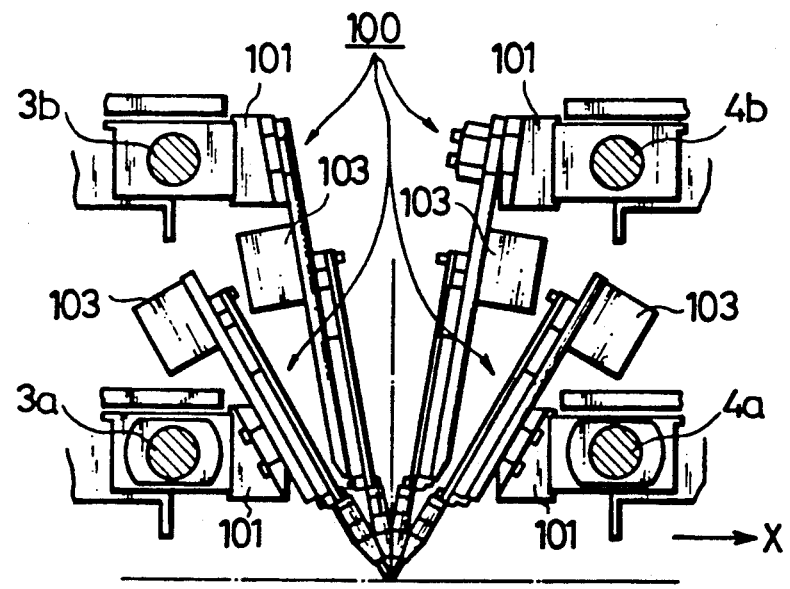
FIG. 14 shows the manner in which four arms are attached to the upper and lower crossbar assemblies of two guide sets.
Figure 15:
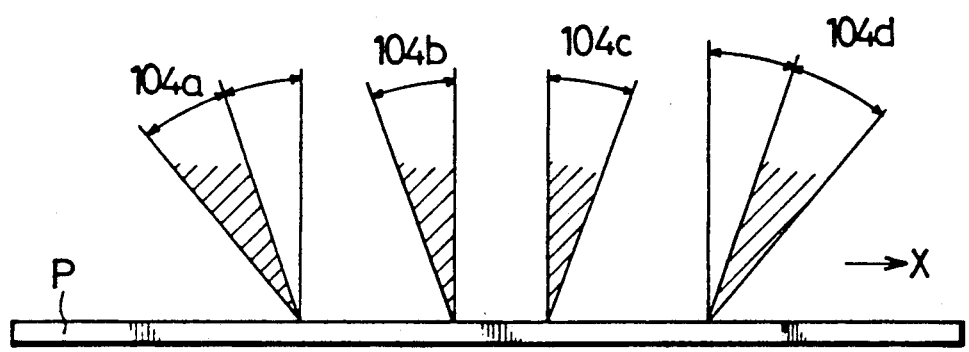
FIG. 15 shows the arrangement of the four probe heads as seen in the Y-direction.
Figure 16:
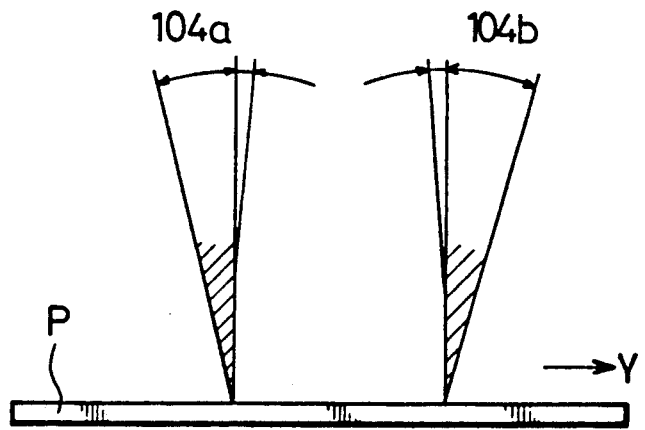
FIG. 16 shows the arrangement of the four probe heads as seen in the X-direction.
Figure 17:
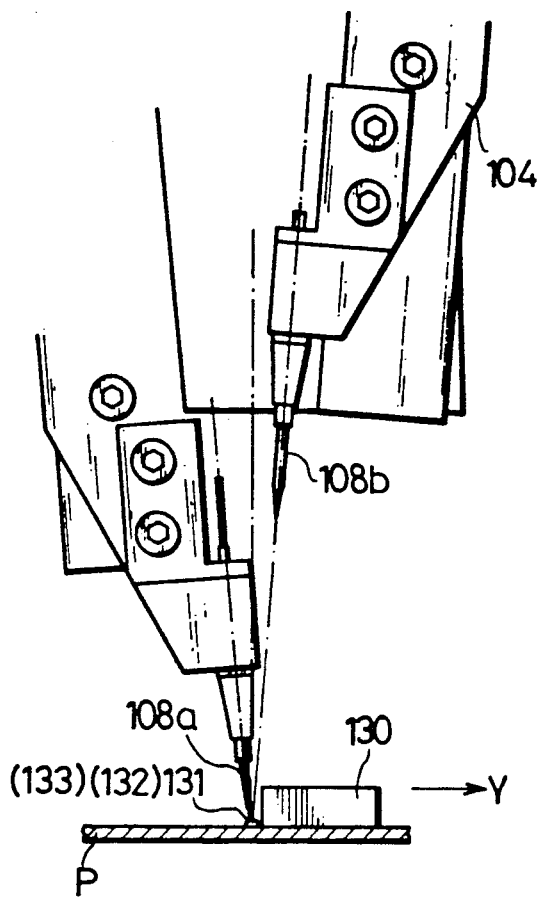
FIGS. 17 and 18 show the probe heads in different inspecting positions.
Figure 18:
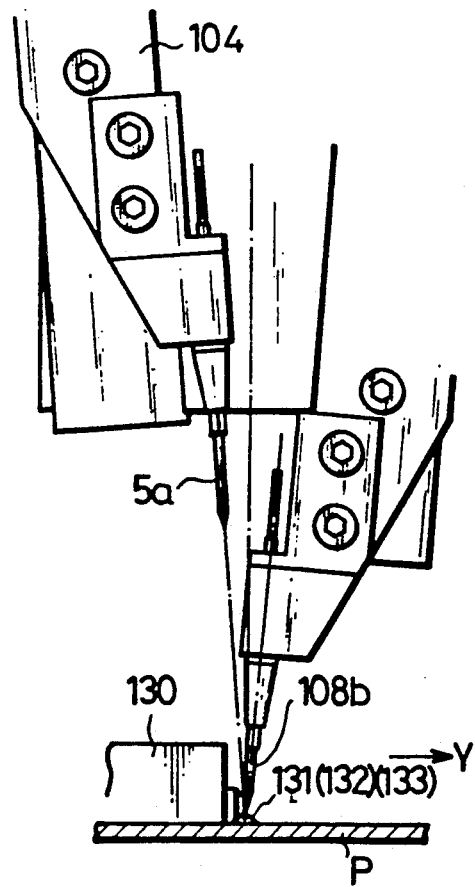
Figure 19:
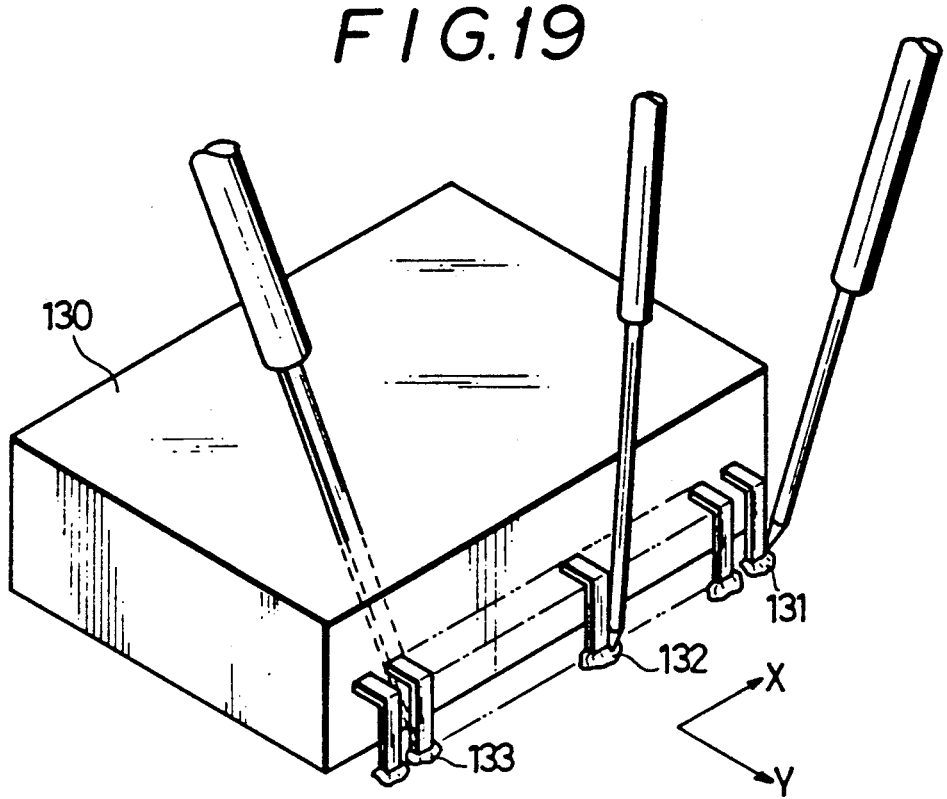
FIG. 19 is a perspective view showing the manner in which measurements are made simultaneously at three points.
Figure 20:
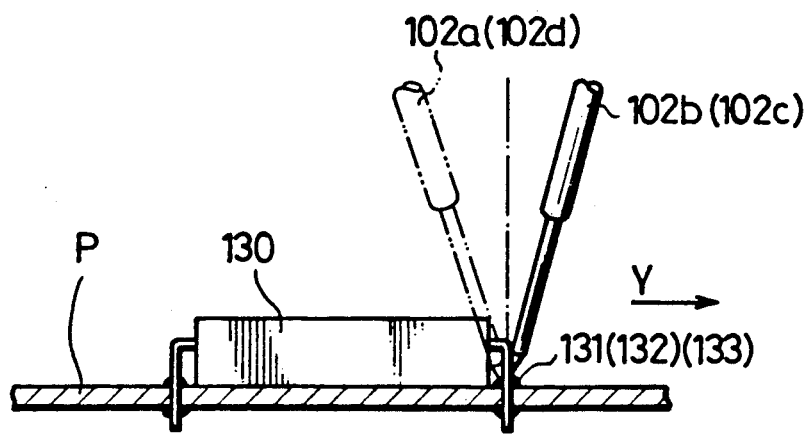
FIG. 20 is a side view showing a simultaneous measurement at three points.

As shown in FIG. 12, a pair of arms 100 are mounted to upper and lower crossbar assemblies 3b and 3a at different inclined angles so that upper and lower probe heads 104 cannot interfere with each other when traveling in Y-direction. As shown in FIG. 14, arms 100 are attached to associated crossbar assemblies 3a, 3b and 4a, 4b so that all probe heads may be oriented towards one and same line in Y-direction. Also, as shown in FIG. 15, probe heads 104a and 104b associated with one guide set and probe heads 104c and 104d associated with the other guide set are arranged within predetermined inclination ranges (hatched areas) as viewed in X-direction, so that their longitudinal phantom lines may converge into a predetermined point.

As described above, when opposite pins 106 of rotatable link plate 105 move to follow arc paths in opposite directions, probe heads 104 rise or lower through the agency of pin-and-lateral slot joint. The rotary angle $\beta$ of rotary link plate 105 is about 70 degrees. The distance range within which probe heads 104 can travel is limited by photo sensors 114a and 114b, and the absolute traveling distance is determined by the distance from the center 103a of rotary link plate 105 to pin 106.

As stepping motor 103 rotates at regular steps or fixed speed, the speed at which probe heads 104 start rising or lowering from initial horizontal position (See FIG. 7) is maximum, and the speed at which probe heads 104 are about to reach upper or lower dead point (broken lines) is minimum.

Printed circuit board inspection apparatus equipped with such arms 100 as described above will work basically in the same way as the first embodiment of FIGS. 1 to 6. In this inspection apparatus according to the second embodiment, however, one of the two probes 108 of each of selected three arms can be brought respectively to each of the selected three terminals 131, 132 and 133 arranged in one direction in a selected integrated circuit 130 so as to perform a three point measurement at one time, as seen from FIGS. 17 to 20. Thanks to the use of stepping motors 103 probe heads 104 can rise or lower quickly in response to commands from central processing unit 6. Also, advantageously two probes of different shapes can be attached to a single arm, thus permitting selection of either probe as most appropriate for making an inspection on a selected point in a printed circuit board.

Figure 21:
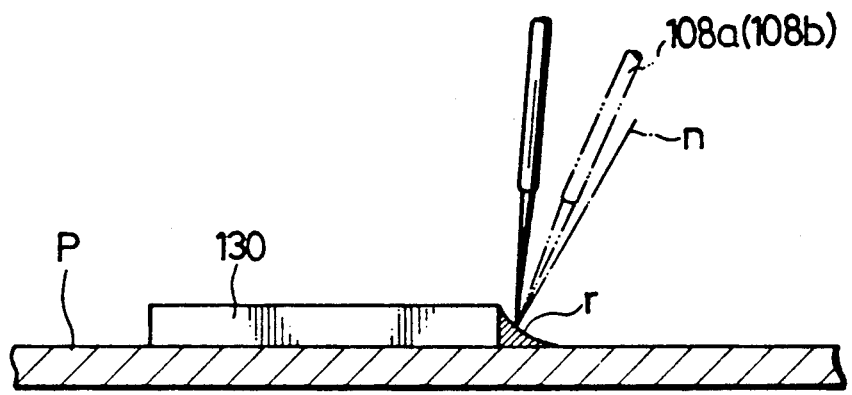
FIG. 21 shows a probe applied to a selected point at which an inspection is made.
Figure 22:
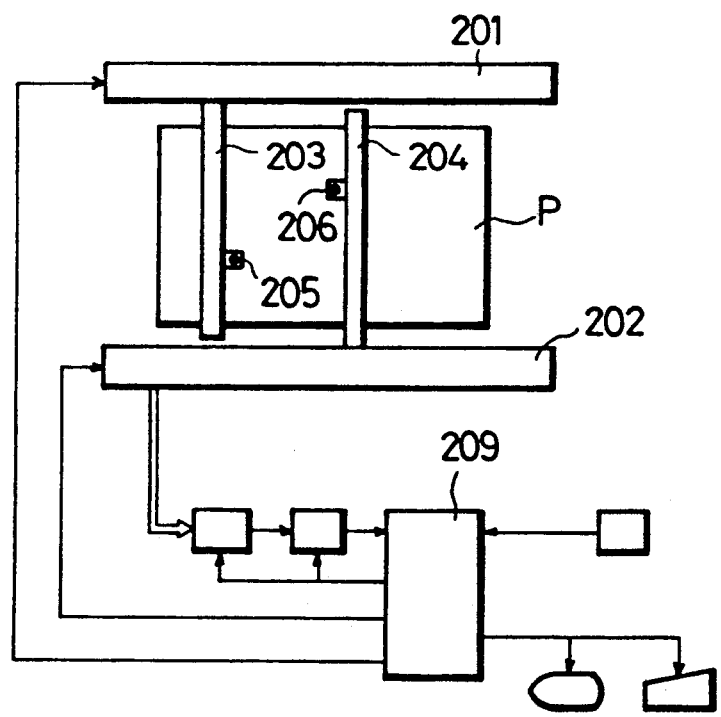
FIG. 22 shows schematically a conventional printed circuit board inspection apparatus.

Two probes 108a and 108b of one arm are inclined at a relatively large angle with respect to the center line of the arm in Y-direction, and therefore one probe 108a or 108b can be applied to a selected curved edge of an integrated circuit 130 at an inclined angle which is close to the normal line, as indicated by phantom line in FIG. 21. The range within which a measurement can be made in a printed circuit board is substantially expanded.

This second embodiment uses two guide sets each composed of upper and lower crossbar assemblies each having a single arm equipped with a pair of probes. As a matter of course three crossbar assemblies each equipped with a single arm may be used.

We claim:

1. Printed circuit board inspection apparatus comprising:

mounting means to fix a printed circuit board at a predetermined position;

two or more guide sets each composed of a pair of upper and lower crossbar assemblies, each crossbar assembly having an arm suspending from the crossbar assembly and equipped with at least one inspection probe at its end, and driving means to drive the crossbar assembly in an X-direction above said printed circuit board, and to drive said arm in a Y-direction perpendicular to said X-direction and raise or lower associated probe; and a central processing unit to command said driving means to bring selected inspection probes to selected positions above said printed circuit board and to lower such inspection probes until they come to contact the terminals of selected discrete circuit elements or printed circuit for detecting short-circuits or disconnections if any, in said printed circuit board, or for determining the kind or function each of said selected discrete circuit elements, whereby the inspection probes of one guide set are making an inspection on a selected circuit element or printed circuit while the inspection probes of the other guide set are running to another selected position in which another inspection is to be performed under the control of said central processing unit.

2. Printed circuit board inspection apparatus claimed in claim 1, wherein each arm comprises a metal piece slidably mounted to an associated crossbar assembly, a mount plate fixed to said metal piece, a pair of probe heads vertically movably fixed to said mount plate, and drive means to raise or lower said prove heads, said inspection probes being fixed to said pair of probe heads.

3. Printed circuit board inspection apparatus claimed in claim 2, wherein said drive means to raise or lower said probe heads comprises a stepping motor, a rotatable link plate connected to a shaft of said stepping motor at the center of the rotatable link plate, and having two pins projecting from the opposite ends of the rotatable link and slidably fitted in lateral slots made in the upper ends of said probe heads, whereby when said stepping motor rotates said rotatable link plate to move said pins along a circular path in opposite directions while remaining in said lateral slots, one probe head is raised while the other probe head is lowered.

4. Printed circuit board inspection apparatus claimed in claim 3, wherein said pair of probe heads are fixed to said mount plate so as to converge and cross in their phantom extensions at a predetermined point in same plane.

5. Printed circuit board inspection apparatus claimed in claim 4, wherein said pair of probe heads have inspection probes of same kind.

6. Printed circuit board inspection apparatus claimed in claim 4, wherein said pair of probe heads have inspection probes of different kinds.

* * * * *